(12) United States Patent
Miyagawa

(10) Patent No.: US 6,780,023 B2
(45) Date of Patent: Aug. 24, 2004

(54) PRINTED WIRING BOARD HAVING PLURALITY OF CONDUCTIVE PATTERNS PASSING THROUGH ADJACENT PADS, CIRCUIT COMPONENT MOUNTED ON PRINTED WIRING BOARD AND CIRCUIT MODULE CONTAINING WIRING BOARD WITH CIRCUIT COMPONENT MOUNTED THEREON

(75) Inventor: Kaoru Miyagawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/228,950

(22) Filed: Aug. 28, 2002

(65) Prior Publication Data

US 2003/0114024 A1 Jun. 19, 2003

(30) Foreign Application Priority Data

Dec. 18, 2001 (JP) ...................................... 2001-384823

(51) Int. Cl.[7] ................................................ H01R 9/09
(52) U.S. Cl. ......................................... 439/68; 439/937
(58) Field of Search .............................. 439/68, 78, 83, 439/590, 937; 361/760, 764, 777, 767, 720, 736, 748

(56) References Cited

U.S. PATENT DOCUMENTS

| 5,641,946 A | * | 6/1997 | Shim ........................... 174/261 |
| 6,168,972 B1 | * | 1/2001 | Wang et al. ................. 438/108 |
| 6,443,351 B1 | * | 9/2002 | Huang et al. ............... 228/103 |

FOREIGN PATENT DOCUMENTS

| JP | 2001-015636 | 1/2001 |
| JP | 2001-230533 | 8/2001 |

* cited by examiner

*Primary Examiner*—Ross Gushi
*Assistant Examiner*—Phuongchi Nguyen
(74) *Attorney, Agent, or Firm*—Finnegan, Henderson, Farabow, Garrett & Dunner, L.L.P.

(57) ABSTRACT

A printed wiring board comprises a substrate having a packaging area to mount a circuit component, a plurality of pads arranged in a grid on the packaging area of the substrate, and a plurality of conductive patterns connected to the pads. At least a few of the pads located at the periphery of the packaging area are made smaller than those located inside.

11 Claims, 4 Drawing Sheets

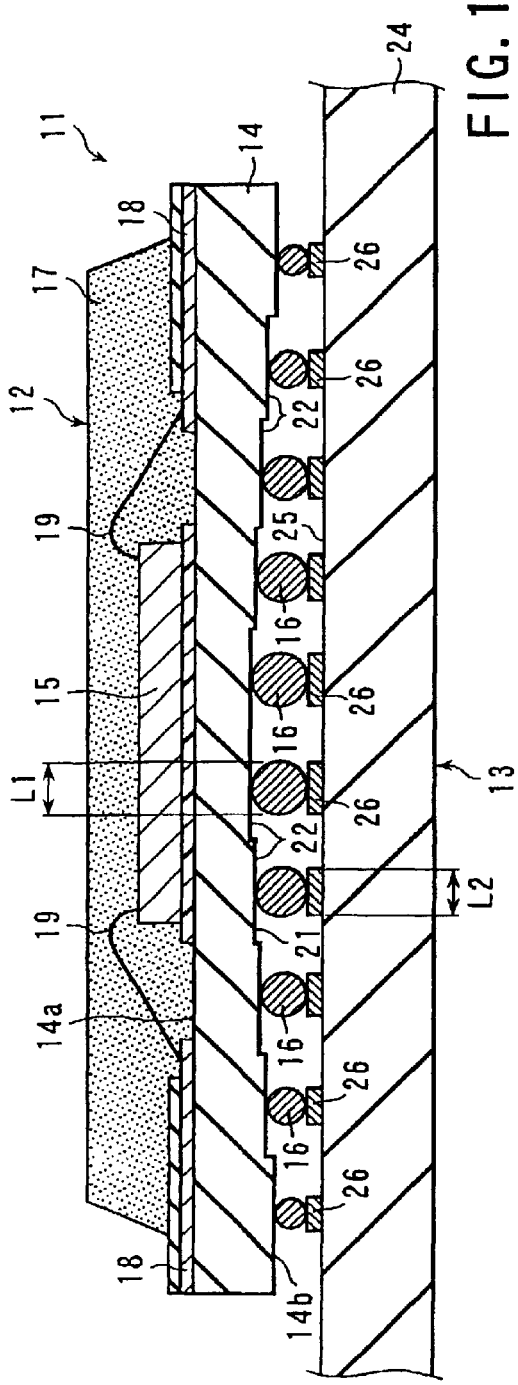
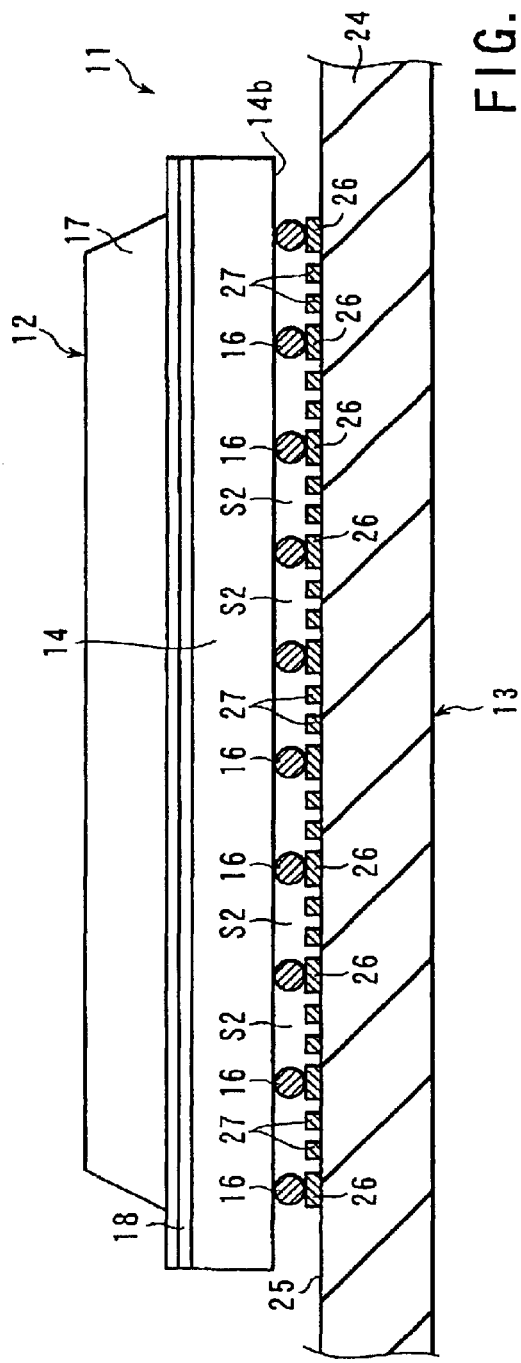

PRINTED WIRING BOARD HAVING PLURALITY OF CONDUCTIVE PATTERNS PASSING THROUGH ADJACENT PADS, CIRCUIT COMPONENT MOUNTED ON PRINTED WIRING BOARD AND CIRCUIT MODULE CONTAINING WIRING BOARD WITH CIRCUIT COMPONENT MOUNTED THEREON

CROSS-REFERENCE TO RELATED APPLICATIONS

This application is based upon and claims the benefit of priority from the prior Japanese Patent Application No. 2001-384823, filed Dec. 18, 2001, the entire contents of which are incorporated herein by reference.

BACKGROUND OF THE INVENTION

1. Field of the Invention

The present invention relates to a printed wiring board having a plurality of pads arranged like a grid, surface mount circuit component, like a ball grid array (BGA) type semiconductor package, mounted on the printed wiring board, and a circuit module with the circuit component mounted on the printed wiring board.

2. Description of the Related Art

Increased integration and performance of a semiconductor package used in electronic apparatus such as a portable computer tends to increase the number of terminals in such a semiconductor package. Recently, a BGA (Ball Grid Array) package is noticed to solve the problem and realize a high packing density.

A BGA package comprises a package substrate with previously mounted an IC chip and a plurality of solder balls arranged like a grid on the backside of the package substrate. These solder balls are soldered to a printed wiring board. A printed wiring board has a packaging area to mount a BGA package and a plurality of pads arranged in a grid. The pads have a plane circular surface and are soldered to the solder balls. In a conventional printed wiring board, all pads are equal in size (diameter) and are arranged at the same intervals. The pads are electrically connected to conductive patterns formed on the packaging area.

All pads are the same size in a conventional printed wiring board. Thus, as the intervals between the pads are reduced, only one conductive pattern can be formed in the narrow space between adjacent pads.

In this arrangement, when pulling the conductive patterns of all pads out of the packaging area, the conductive patterns connected to the pads of the second row from the outermost can be pulled out through the space among the first-row pads. However, the conductive patterns connected to the pads of the third and later rows cannot be pulled out through the space between the pads arranged after the third row.

Therefore, a multilayer printed wiring board with alternately laminated conductor and insulating layers is conventionally used. A multilayer printed wiring board has a plurality of through holes adjacent to the pads of the third and later rows at the middle of the packaging area. These through holes provide electrical connection between a plurality of inside conductor layers and the conductive patterns connected to the pads of the third and later rows.

With the above structure, a plurality of pads arranged at the middle of the packaging area is electrically connected to the inside conductor layers through a plurality of through holes. Thus, as the number of pads is increased, the number of conductor layers is also increased. This will increase the cost of the board. Moreover, the existence of through holes means that a conductor layer cannot be formed in some parts of the board. Thus, designing the conductor layer pattern and layout requires much time and effort.

Jpn. Pat. Appln. KOKAI Publication No. 2001-230533 disclosed a printed wiring board in which the shape of a pad to solder a solder ball is not a circle, but, elliptical having long and short axes, for example. In this printed wiring board, a large space can be taken between adjacent pads by modifying the arrangement of pads. Thus, a plurality of conductive patterns can be passed through adjacent pads, decreasing the number of layers and through holes.

However, in the above printed wiring board, the shape and direction of pads become different at a few locations on the packaging area. This requires much time and manpower in designing the pad and layout, provide little cost reduction compared to a conventional multilayer printed wiring board.

BRIEF SUMMARY OF THE INVENTION

It is an object of the present invention to provide a printed wiring board which permits passing a plurality of conductive patterns between adjacent pads without complicating the pad shape and layout.

To achieve the above objects, a printed wiring board according to the present invention comprises a substrate having a packaging area to mount a circuit component with a plurality of connection terminals, a plurality of pads arranged in a grid in the packaging area of the substrate, and a plurality of conductive patterns connected to the pads. The pads are electrically connected to the connection terminals of the circuit component, and at least a few of the pads located at the periphery of the packaging area are made smaller than those located inside.

With this structure, the space between adjacent pads increases toward the periphery of the packaging area, and a plurality of conductive patterns can be easily passed through adjacent pads. Thus, a plurality of conductive patterns connected to the pads located inside of those at the periphery can be pulled out of the packaging area through adjacent pads.

Further, the pads located at the periphery and the others are different only in size, and the shape and the direction against the packaging area are the same. This facilitates the design and layout of the pads, and reduces the cost of the printed wiring board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

FIG. 1 is a sectional view of a circuit module showing the relation between a plurality of solder balls and a plurality of pads in a first embodiment of the present invention;

FIG. 2 is a sectional view of a circuit module with a plurality of conductive patterns passed through adjacent pads in the first embodiment of the invention;

DETAILED DESCRIPTION OF THE INVENTION

Figure 3:
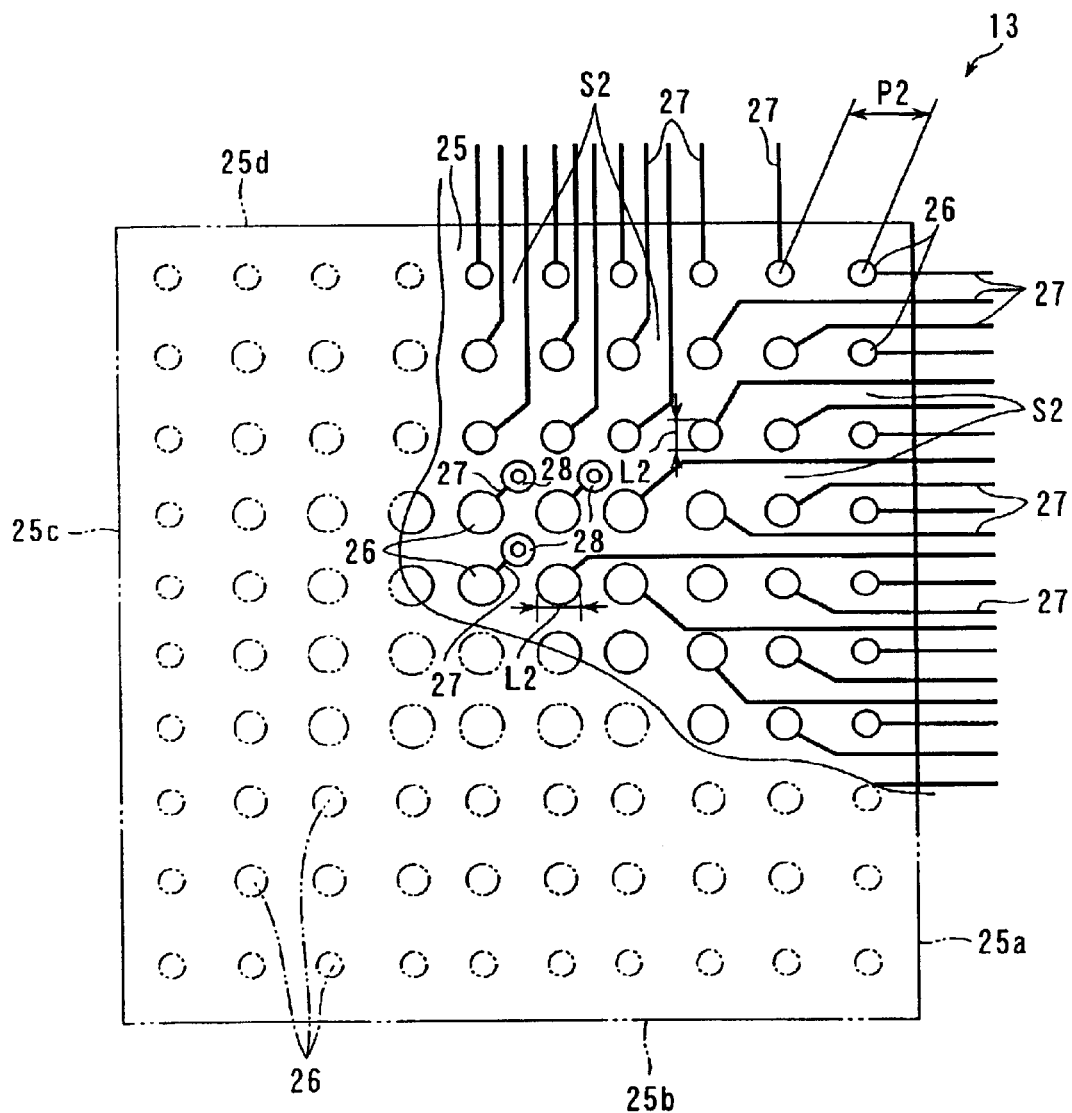
FIG. 3 is a plane view of a printed wiring board with a plurality of conductive patterns led out of the packaging area by passing through adjacent pads.

A first embodiment of the present invention will be described hereinafter with reference to FIG. 1 and FIG. 4.

FIG. 1 shows a circuit module 11 used in an electric apparatus such as a portable computer. The circuit module 11 comprises a ball grid array (BGA) type semiconductor package 12 and a printed wiring board 13.

The semiconductor package 12 constitutes a surface mount circuit component. The semiconductor package 12 comprises a package substrate 14, an IC chip 15 and a plurality of solder balls 16. The package substrate 14 has a first surface 14a and a second surface 14b as a terminal surface. The second surface 14b is the opposite side of the first surface 14a. The IC chip 15 is mounted on the first surface 14a of the package substrate 14, and is covered by a synthetic resin mold material 17. Solder balls 16 constitute connection terminals of the semiconductor package 12, and are located on the second surface 14b of the package substrate 14.

A plurality of wiring layers 18 is laminated on the first surface 14a of the package substrate 14. The wiring layers 18 are electrically connected to a plurality of electrodes (not shown) of the IC chip 15 through wires 19.

Figure 4:
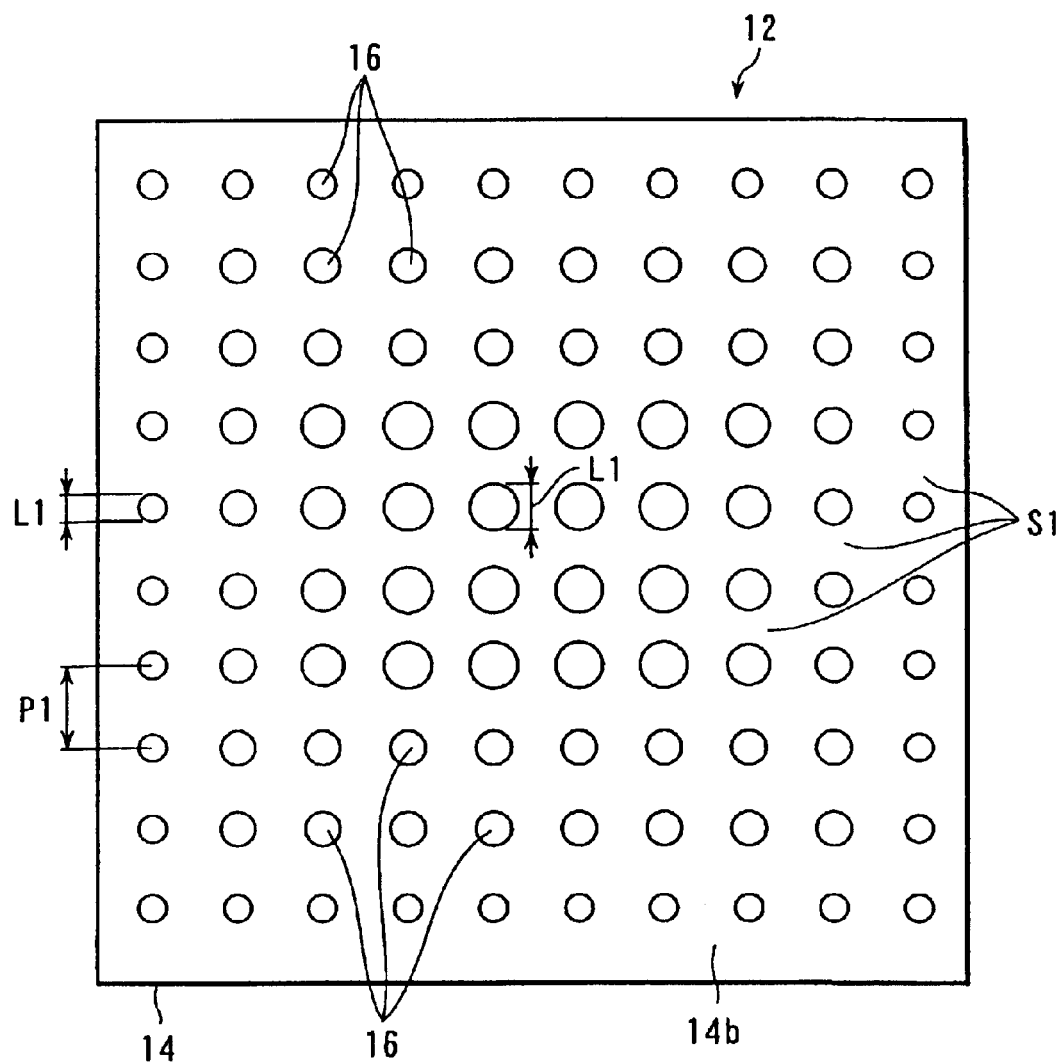
FIG. 4 is a plane view of a BGA type semiconductor package showing the layout of a plurality of solder balls.

As shown in FIG. 1 and FIG. 4, the solder balls 16 have a circle cross section, and are arranged in a grid on the second surface 14b of the package substrate 14. The solder balls 16 are electrically connected to said wiring layers 18 through a plurality of through holes and via holes formed in the package substrate 14. The distance P1 between the solder balls 16 adjacent in the circumferential direction is the same.

According to this embodiment, the diameter L1 of the solder balls 16 decreases toward the periphery of the second surface 14b; largest at the center and smallest at the ends of the second surface 14b of the package substrate 14. Thus, at least a few solder balls 16 arranged at the periphery of the second surface 14b of the package substrate 14 are smaller than the others arranged inside. The space S1 between adjacent solder balls 16 increases toward the periphery of the second surface 14b of the package substrate 14.

As seen from FIG. 1, the package substrate 14 has a concave 21 on the second surface 14b. The concave 21 has a plurality of terminal support portions 22 arranged like stairs. The depth of the terminal support portions 22 increases stepwise toward the center from the periphery of the second surface 14b. The level difference between adjacent terminal support portions 22 is identical to the difference in the diameter L1 of the adjacent solder ball 16. Therefore, the depth of the terminal support portion 22 located at the center of the second surface 14b of the package substrate 14 is maximum, and solder balls 16 with the largest diameter L1 are located at this position. Solder balls 16 with the next largest diameter L1 are placed at the terminal support portion 22 of the next stage adjacent to that center terminal support portion 22 with the maximum depth.

As a result, the diameter L1 of solder balls 16 decreases stepwise toward the periphery of the second surface 14b. The difference in the diameter L1 between the adjacent solder balls 16 is absorbed by the level difference between the adjacent terminal support portions 22. Therefore, the edges of solder balls 16 opposite to the package substrate 14 are placed on the same plane.

Whereas, the above-mentioned printed wiring board 13 has a multilayer substrate 24. The substrate 24 includes a plurality of conductor layers and insulating layers laminated alternately. The substrate 24 has a packaging area 25 to mount the semiconductor package 12 on its surface. As shown in FIG. 3, the packaging area 25 is made square to meet the package substrate 14, and has four peripheral edges 25a, 25b, 25c and 25d orthogonal to one another.

A plurality of pads 26 are arranged on the packaging area 25 of the substrate 24. Each pad 26 is made circular with a plane surface, and arranged in a grid corresponding to the solder balls 16 in the semiconductor package 12. The distance P2 between adjacent pads 26 is equal. Each pad 26 is soldered to each solder ball 16, thereby electrically connecting the semiconductor package 12 to the printed wiring board 13.

As best shown in FIG. 1 and FIG. 3, the diameter L2 of the pads 26 arranged on the packaging area 25 decreases toward the periphery of the packaging area. Thus, a few pads 26 located at the periphery are smaller than those located inside. The space S2 between adjacent pads 26 on the packaging area 25 increases toward the periphery of the packing area.

As shown in FIG. 3, a plurality of conductive patterns 27 are formed on the packaging area 25 of the printed wiring board 13. Each conductive pattern 27 is electrically connected to each pad 26. The conductive patterns 27 extending from the first-row pads 26 located at the periphery of the packaging area 25 are led out of the packaging area 25 over the peripheral edges 25a, 25b, 25c and 25d of the packaging area 25.

The conductive patterns 27 extending from the second-row pads 26, located further inside than the first-row pads 26, are led out of the packaging area 25 passing through the space S2 between the first-row pads 26. The conductive patterns 27 extending from the third-row pads 26 located further inside than the second-row pads 26 are led out of the packaging area 25 passing through the space S2 between the pads 26 of the first and second rows. Likewise, the conductive patterns 27 extending from some of the fourth-row pads 26 located still further inside than the third-row pads 26, and the conductive patterns 27 extending from some of the fifth-row pads 26 located at the center of the packaging area 25 are led out of the packaging area 25 passing through the space S2 between the pads 26 of the first to third rows.

As shown in FIG. 3, the substrate 24 has a plurality of through holes 28 at the middle of the packaging area 25. The through holes 28 provide electrical connection between a plurality of conductive patterns 27 extending from the remaining pads 26 of the fourth and fifth rows and the conductor layers in the substrate 24.

With this structure, the pads 26 on the printed wiring board 13 are formed so that the diameter L2 decreases toward the periphery of the packaging area 25. Thus, the space S2 between adjacent pads 26 increases toward the periphery of the packaging area 25, making it possible to pass a plurality of conductive patterns 27 through this space S2.

As a result, the conductive patterns 27 extending from the pads 26 of the second and later rows located further inside of the first-row pads 26 at the periphery of the packaging area 25 can be led out of the packaging area 25 through that space S2. This can decrease the number of conductor layers and through holes 28 in the substrate 24, and simplify the structure of the printed wiring board 13.

Furthermore, the pads 26 arranged on the packaging area 25 are made as circles with different diameters, and all pads 26 are similar in shape. This eliminates the necessity of specifying the directions of these pads 26 when forming them on the packaging area 25. Therefore, the design and layout of the pads 26 is much easier, compared to the aforementioned technology disclosed in the Japanese Patent, thus and the manufacturing cost of a printed wiring board 13 can be reduced.

This will decrease the cost of a circuit module 11, realizing a low-cost circuit module 11.

In addition, with the above structure, solder balls 16 in the semiconductor package 12 are made so that the diameter L1 decreases toward the periphery of the package substrate 14, to meet the varied sizes of pads 26. Thus, the solder balls 16 located at the periphery of the package substrate 14 will not project over the pads 26 located at the periphery of the packaging area 25. In other words, the solder balls 16 will not project over a plurality of conductive patterns 27 passed through adjacent pads 26. As a result, contact between solder balls 16 and conductive patterns 27 can be avoided, ensuring reliable electrical connection.

Moreover, the semiconductor package 12 includes the stair-like concave 21 having a plurality of terminal support portions 22 on the second surface 14b of the package substrate 14. The solder balls 16 are located at each terminal support portion 22. Thus, the difference in the diameter L1 between the adjacent solder balls 16 is absorbed by the level difference between the adjacent terminal support portions 22. The edges of solder balls 16 facing the pads 26 can be placed on the same plane.

Therefore, when the semiconductor package 12 is mounted on the packaging area 25 of the printed wiring board 13, all solder balls 16 make even contact with pads 26, providing stable connection therebetween.

Figure 5:
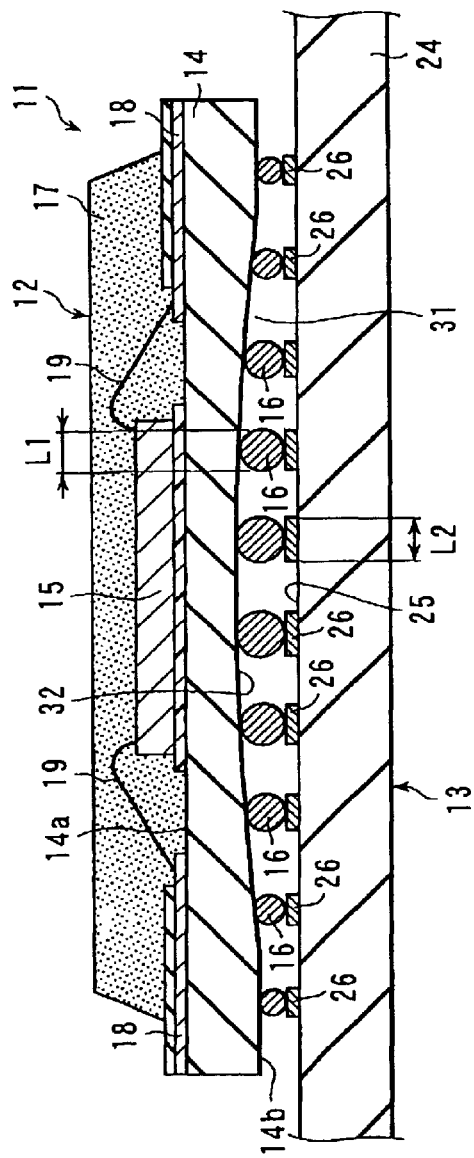
FIG. 5 is a sectional view of a circuit module according to a second embodiment of the invention.

The present invention is not restricted to the above-mentioned first embodiment. FIG. 5 shows a second embodiment of the invention.

The second embodiment is different from the first embodiment in that a plurality of solder balls 16 with different diameters L1 are arranged on the same plane. Apart from this, the basic configuration of a circuit module 11 is the same as the first embodiment.

As shown in FIG. 5, a package substrate 14 has a concave 31 on the second surface 14b. The concave 31 has a slope 32 facing the packaging area 25 of a printed wiring board 13. The slope 32 is inclined so as to separate farther from the packaging area 25 as it advances from the ends to the center of the second surface 14b. The solder balls 16 are arranged in a grid on the slope 32.

Therefore, the depth of the concave 31 is maximum at the middle of the slope 32, and decreases gradually toward the ends of the slope 32. Thus, solder balls 16 with the largest diameter L1 are located at the middle of the slope 32, and the other solder balls 16 with the smaller diameters L1 are located at the positions displaced toward the ends of the slope 32 by the distance equivalent to the space P1 between adjacent solder balls 16. As a result, the difference in the diameter L1 between the adjacent solder balls 16 is absorbed by the inclination of the slope 32.

With this structure, the edges of solder balls 16 facing the pads 26 can be placed on the same plane. Therefore, when the semiconductor package 12 is mounted on the packaging area 25 of the printed wiring board 13, all solder balls 16 make even contact with pads 26, providing stable connection therebetween.

Figure 6:
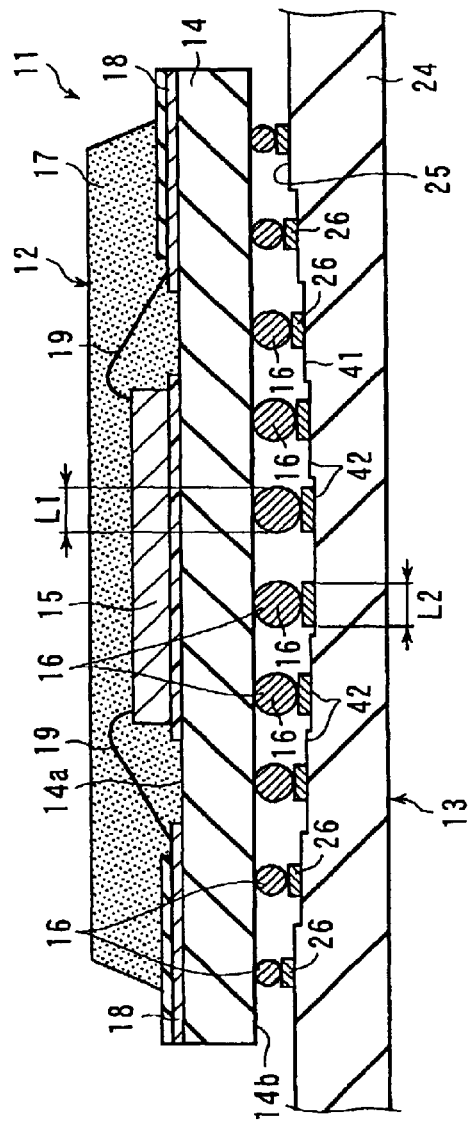
FIG. 6 is a sectional view of a circuit module according to a third embodiment of the invention.

FIG. 6 shows a third embodiment of the invention.

In the third embodiment, the second surface 14b of the package substrate 14 is made flat having no concave. A plurality of solder balls 16 with different diameters L1 are arranged in a grid under the second surface 14b. Thus, the diameter of solder balls 16 increases toward the center of the second surface 14b.

A printed wiring board 13 has a concave 41 on the packaging area 25. The concave 41 includes a plurality of pad support portions 42. The depth of the pad support portions 42 increases stepwise toward the center from the ends of the packaging area 25. Pads 26 are located on each pad support portion 42. The level difference between the adjacent pad support portions 42 is identical to the diameter L1 of the adjacent solder balls 16.

Therefore, the depth of the pad support portion 42 located at the center of the packaging area 25 is maximum, and solder balls 16 with the largest diameter L1 are placed on this pad support portion 42. Solder balls 16 with the next largest diameter L1 are placed on the pads 26 on the next stage adjacent to that pad support portion 42 at the center with the maximum depth.

As a result, although the diameter L1 of the solder balls 16 on the second surface 14b of the package substrate 14 decreases toward the periphery of the second surface 14b, the diameter difference between the adjacent solder balls 16 is absorbed by the level difference between the adjacent pad support portions 42.

With this structure, as a stair-like concave 41 is formed on the packaging area 25 of the printed wiring board 13, all solder balls 16 make even contact with pads 26 when the semiconductor package 12 is mounted on the packaging area 25. And, as in the first and second embodiments, stable connection is obtained between the solder balls 16 and pads 26.

In each embodiment described above, a solder ball is used as a connection terminal of a semiconductor package, but a solder post with a circular cross section can be used instead of a solder ball.

Further, the plane surface of a connection terminal and a pad is not restricted to a circle. For example, a square or a polygon is also permitted.

Further, a surface mount circuit component of the present invention is not restricted to a BGA type semiconductor package. For example, a socket which removably supports a PGA type semiconductor package can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed wiring board comprising:
   a substrate having a packaging area to mount a ball grid array type semiconductor package, the packaging area including a stepped concave surface comprising a plurality of pad support portions in which the depths increase in stages from a periphery towards a center direction, the semiconductor package comprising:

a package substrate to mount an IC chip; and a plurality of solder balls arranged in a grid on the package substrate, wherein the diameters of the solder balls become smaller in stages from a center of the packaging area toward a periphery direction;

a plurality of pads arranged in a grid on the pad support portions of said stepped concave surface, said pads being electrically connected to the solder balls of the semiconductor package, wherein the size of said pads becomes smaller in stages from a center of the packaging area towards a periphery direction thereby making each pad connect equally with a corresponding solder ball of the semiconductor package; and a plurality of conductive patterns formed on the packaging area and connected to each of said pads, wherein at least a few of said conductive patterns are led out of said packaging area passing through adjacent pads.

2. The printed wiring board according to claim 1, wherein said pads have a shape to meet said connection terminal.

3. The printed wiring board according to claim 1, wherein all said pads are the same in shape.

4. The printed wiring board according to claim 1, wherein said pads have a plane circular surface.

5. The printed wiring board according to claim 4, wherein the diameter of said pads decreases toward the periphery of said packaging area.

6. A ball grid array semiconductor package to be mounted on a printed wiring board comprising a substrate having a packaging area, a plurality of pads arranged in a grid on said packaging area and a plurality of conductive patterns electrically connected to said pads, said ball grid array semiconductor package comprising:

a terminal surface facing the packaging area of said printed wiring board, the terminal surface including a stepped concave surface comprising a plurality of terminal support portions of which the depth increase in stages from the periphery towards the center direction; and a plurality of solder balls arranged in a grid on the terminal support portions of said terminal surface, wherein said solder balls are electrically connected to said pads, and wherein the diameters of the solder balls become smaller in stages from a center of the terminal surface in a periphery direction thereby making each of the solder balls each connect equally with a corresponding pad of the printed wiring board.

7. The semiconductor package according to claim 6, wherein said pads of said printed wiring board have the shape to meet the solder balls.

8. The semiconductor package according to claim 7, wherein all said pads are the same in shape.

9. A circuit module comprising:

a printed wiring board including a substrate having a packaging area, a plurality of pads arranged in a grid on said packaging area and a plurality of conductive patterns electrically connected to said pads, wherein the size of said pads become smaller in stages from a center of the packaging area towards a periphery direction; and a surface mount circuit component mounted on said packaging area of said substrate, said circuit component including a surface facing said packaging area, a stepped concave surface formed on said surface comprising a plurality of terminal support portions in which a depth increases in stages from a periphery of said surface towards a center direction and a plurality of solder balls arranged in a grid on said terminal support portions of said surface and being electrically connected to said pads, wherein the diameters become smaller in stages from a center of the surface toward a periphery direction making each of the solder balls connect equally with a corresponding pad of the printed wiring board.

10. The circuit module according to claim 9, wherein at least a few of said conductive patterns are led out of said packaging area passing through adjacent pads.

11. The circuit module according to claim 9, wherein said circuit component includes a ball grid array (BGA) type semiconductor package.

* * * * *